United States Patent [19]

Matsunaga et al.

[11] Patent Number: 5,640,329
[45] Date of Patent: Jun. 17, 1997

[54] METHOD OF ESTIMATING HEAT GENERATED IN CHIP

[75] Inventors: Mitsunori Matsunaga; Kiyotake Yoshimaru; Masateru Murakami, all of Hyogo, Japan

[73] Assignee: Mitsubishi Denki Kabushiki Kaisha, Tokyo, Japan

[21] Appl. No.: 416,309

[22] Filed: Apr. 4, 1995

[30] Foreign Application Priority Data

Aug. 9, 1994 [JP] Japan .................................. 4-186971

[51] Int. Cl.$^6$ ................................................ G06F 17/50
[52] U.S. Cl. ....................... 364/490; 364/488; 364/489; 364/491
[58] Field of Search .................................. 364/578, 488, 364/489, 490, 491, 483, 557, 468, 550; 307/271; 374/31; 235/151.1

[56] References Cited

U.S. PATENT DOCUMENTS

| 3,674,995 | 7/1972 | Kendall | 235/151.1 |
|---|---|---|---|
| 4,802,099 | 1/1989 | Logue | 364/491 |
| 5,050,114 | 9/1991 | Lee | 364/578 |
| 5,189,314 | 2/1993 | Georgiou et al. | 307/271 |
| 5,202,843 | 4/1993 | Kunimine et al. | 364/578 |
| 5,249,141 | 9/1993 | Vanderbroek et al. | 364/557 |
| 5,287,284 | 2/1994 | Sugino et al. | 364/468 |
| 5,287,292 | 2/1994 | Kenny et al. | 364/550 |
| 5,311,448 | 5/1994 | Waggoner et al. | 364/578 |
| 5,356,216 | 10/1994 | Jeng | 374/31 |
| 5,379,230 | 1/1995 | Morikawa et al. | 364/483 |
| 5,404,310 | 4/1995 | Mitsuhashi | 364/490 |

*Primary Examiner*—Kevin J. Teska
*Assistant Examiner*—Russell W. Frejd
*Attorney, Agent, or Firm*—Oblon, Spivak, McClelland, Maier & Neustadt, P.C.

[57] ABSTRACT

At Step S1, the circuit forming the semiconductor integrated circuit to be designed is divided into sub circuits, and the area sizes and the positions of blocks to seat the sub circuits are determined on a chip. At Step S2, only flip-flops are counted as cells which are assumed to be the source of heat. At Step S3, a heat quantity per unit area in each block (i.e., average heat quantity) is calculated for each sub circuit. More specifically, average heat quantities are calculated from the area sizes of the blocks, the number of the flip-flops of each sub circuit, and the amount of heat generated in each flip-flop during operation of the flip-flop. Heat generated in a semiconductor integrated circuit is estimated easily by considering only a clock signal.

18 Claims, 16 Drawing Sheets

0:    CLK1=L
20:   CLK1=H
30:   CLK1=L
70:   CLK1=H
80:   CLK1=L
120:  CLK1=H
130:  CLK1=L
170:  CLK1=H
180:  CLK1=L
270:  CLK1=H
280:  CLK1=L
320:  CLK1=H
330:  CLK1=L

CLK1 : 3、5、7、6、0、2、4、0、0、0···

D   : SIG1
CLK : CLK1
Q   : SIG-OUT1
```

```
[FF2]

D   : SIG2
CLK : CLK1
Q   : SIG-OUT2
```

```
[FF3]

D   : SIG3
CLK : CLK1
Q   : SIG-OUT3
```

1

METHOD OF ESTIMATING HEAT GENERATED IN CHIP

BACKGROUND OF THE INVENTION

1. Field of the Invention

The present invention relates to a method of estimating heat which is developed in a chip while designing a circuit, in order to improve the reliability of an LSI and the quality of a layout.

2. Description of the Background Art

The need to estimate heat which is developed in a semiconductor integrated circuit while designing the semiconductor integrated circuit has been noted in the art. This is because heat developed in the semiconductor integrated circuit could cause the semiconductor integrated circuit to operate beyond a predetermined operation condition. If this occurs, it is difficult to ensure that a signal operates at a normal timing.

The importance of power consumption in a chip is stressed in Japanese Patent Laid-Open Gazette No. 3-3348 (Specification, page 3, line 12 to page 4, line 1). The Gazette describes a technique of performing MIN-CUT method so that distribution of a consumption power is uniform in a chip (Specification, page 9, line 9 to page 10, line 4 and FIG. 2).

However, in this conventional technique, it is necessary to exchange cells between a plurality of divided areas. In addition, to exchange the cells, the positions of wire lines must be changed while considering a consumption power. This is not only labor-consuming but also time-consuming to realize.

SUMMARY OF THE INVENTION

According to a first aspect of the present invention, a method of estimating heat which is developed in a semiconductor integrated circuit which is formed by a plurality of sub circuits prior to designing the semiconductor integrated circuit, at least one of the sub circuits including at least one of clock-synchronized elements which operate when a clock signal is activated, the method comprising the steps of: (a) establishing a plurality of seating areas for seating the sub circuits in a design area; (b) finding the number of the clock-synchronized elements in each of the sub circuits; (c) calculating heat quantities of the clock-synchronized elements; and (d) calculating an average heat quantity, which is an average of heat quantities per unit area in each of the seating areas which corresponds to each of the sub circuits, from results obtained by the steps (b) and (c).

Preferably, the clock-synchronized elements are of a plurality of types, and the step (c) uses a heat quantity library for storing heat quantities of the clock-synchronized elements type by type.

According to a second aspect of the present invention, the method of the first aspect further comprises the step of (e) displaying the seating areas with different visual expressions in accordance with the average heat quantities of the seating areas.

Preferably, the different visual expressions are different colors.

According to a third aspect of the present invention, the method of the first aspect further comprises the step of (e) correcting the area sizes of the seating areas so that the average heat quantities become uniform between all of the seating areas.

Preferably, the step (e) comprises the steps of: (e-1) adding up the average heat quantities which are calculated at the step (d); (e-2) dividing a result of the step (e-1) by the number of the seating areas to find a unified average heat quantity; and (e-3) multiplying the area sizes of the seating areas by a value which is obtained by dividing the average heat quantities which are calculated at the step (d) by the unified average heat quantity which is calculated at the step (d) to correct the area sizes of the seating areas.

According to a fourth aspect of the present invention, in the method of the third aspect, the step (e) of correcting the area sizes of the seating areas is performed on only those seating areas whose average heat quantities are over a predetermined upper limit heat quantity value.

According to a fifth aspect of the present invention, the method of the fourth aspect further comprises the step (f) of changing the design area if a sum of the area sizes of the seating areas after performing the step (e) is larger than a predetermined upper limit area size value.

According to a sixth aspect of the present invention, the method of the fifth aspect further comprises the step (g) of displaying the seating areas as they are with the area sizes corrected.

According to a seventh aspect of the present invention, a method of estimating heat which is developed in a semiconductor integrated circuit which is formed by a plurality of sub circuits prior to designing the semiconductor integrated circuit, at least one of the sub circuits including at least one of clock-synchronized elements which operate when a clock signal is activated, the method comprising the steps of: (a) establishing a plurality of seating areas for seating the sub circuits in a design area; (b) finding the number of the clock-synchronized elements in each of the sub circuits; (c) calculating heat quantities of the clock-synchronized elements; (d) arranging wire lines in each of the sub circuits; and (e) displaying the clock-synchronized elements whose positions are determined by the wire lines with different visual expressions in accordance with heat quantities of the clock-synchronized elements.

Preferably, the different visual expressions are different colors.

According to an eighth aspect of the present invention, in the method of the seventh aspect, the step (c) comprises the steps of: (c-1) finding the number of activations of the clock signal; and (c-2) calculating heat quantities of the clock-synchronized elements based on the number found at the step (c-1).

According to a ninth aspect of the present invention, in the method of the eighth aspect, the clock signal is once activated during each of predetermined cyclic periods, the step (c-2) comprises the steps of: (c-2-1) finding a total number of activations of the clock signal during a target period which is one of said cyclic periods and at least one of said cyclic periods which is precedent to the target period; (c-2-2) generating a heat reservation pattern which expresses said cyclic periods from values which are obtained by repeatedly performing the step (c-2-1) while serially updating the target period; and (c-2-3) calculating the heat quantities of the clock-synchronized elements in time sequence in accordance with the heat reservation pattern.

Preferably in the ninth aspect of the present invention, at the step (c-2-2), if there is no activation of the clock signal during the target period, a value of the heat reservation pattern is determined exceptionally as zero even if there is activation of the clock signal during said at least one of said cyclic periods.

Alternatively in the ninth aspect of the present invention, the positions of the clock-synchronized elements are displayed with different colors at the step (e) in accordance with the heat quantities of the clock-synchronized elements which are calculated in time sequence at the step (c-2-3).

In the method according to the first aspect of the present invention, heat quantities of only clock-synchronized elements are utilized. Hence, only the clock signal which is supplied to the semiconductor integrated circuit may be considered in estimating heat generation in the semiconductor integrated circuit. There is no need to consider propagation of all signals which are transmitted within the semiconductor integrated circuit.

In the method according to the first aspect of the present invention, heat which is developed in the sub circuits is estimated in an easy manner as average heat quantities of the corresponding seating areas.

According to the second aspect of the present invention, the seating areas are displayed in such a manner that the associated average heat quantities are easily visually observed.

In the second aspect of the present invention, it is easy to judge which seating area (i.e., sub circuit) generates more heat than the others.

According to the third aspect of the present invention, the area sizes of the seating areas are corrected.

In the third aspect of the present invention, the average heat quantities of the respective seating areas are further averaged and made uniform over the entire semiconductor integrated circuit. As a result, distribution of heat becomes uniform.

According to the fourth aspect of the present invention, the area sizes of only those seating areas whose average heat quantities are over the predetermined upper limit heat quantity value are corrected.

Therefore, any sub circuit which does not meet an environmental condition is corrected so as to satisfy the environmental condition, which improves the reliability of the semiconductor integrated circuit.

According to the fifth aspect of the present invention, the design area is changed.

By changing the design area, it is possible to design the semiconductor integrated circuit on the single design area while satisfying a predetermined requirement regarding heat generation.

According to the sixth aspect of the present invention, the seating areas are displayed with their area sizes corrected.

It is therefore easy to confirm whether the set-up of the seating areas is improved in the design area. Correction of the configurations and the positions of the seating areas is easy.

According to the seventh aspect of the present invention, the heat quantities of the clock-synchronized elements whose positions are determined are displayed in a manner easy to follow.

In the seventh aspect of the present invention, it is possible to find distribution of heat generated by the clock-synchronized elements as they are actually arranged. The uniformity of the heat distribution is enhanced easily by correcting the seating areas.

According to the eighth aspect of the present invention, the number of activations of the clock signal is utilized in calculating the heat quantities of the clock-synchronized elements.

Calculated while utilizing the number of activations of the clock signal, estimated heat quantities of the clock-synchronized elements are more reliable. Even when there are a plurality of clock-synchronized elements which operate in response to different clock signals, the estimated heat quantity is nevertheless reliable.

According to the ninth aspect of the present invention, changes in the heat quantities with time are calculated by serially updating the period.

The heat quantities of the clock-synchronized elements are calculated in time sequence considering even dissipated heat.

According to the tenth aspect of the present invention, the positions of the clock-synchronized elements are displayed in colors in accordance with the heat quantities.

It is therefore possible to visually judge and confirm a heat quantity at a given coordinate point on the design area in time sequence.

Accordingly, it is an object of the present invention to offer a technique for easily estimating heat which is generated in a semiconductor integrated circuit while considering only a clock signal.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 17 and 18 are views explaining the tenth preferred embodiment of the present invention.

DESCRIPTION OF THE PREFERRED EMBODIMENTS

First Preferred Embodiment

Figure 1:
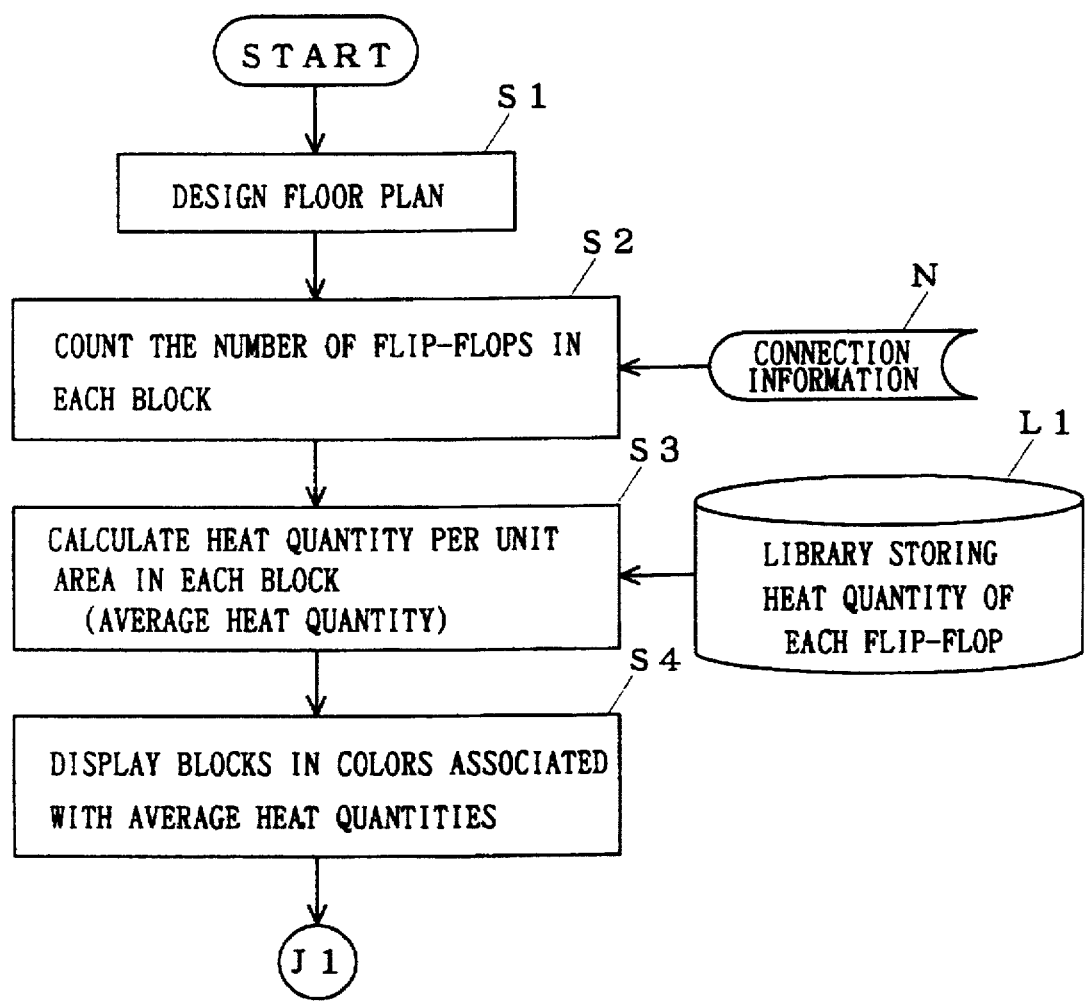
FIG. 1 is a flow chart showing a first and a second preferred embodiments of the present invention.

FIG. 1 is a flow chart showing a first preferred embodiment of the present invention. At Step S1, a floor plan is designed. That is, a circuit which forms a semiconductor integrated circuit to be designed is divided into some sub circuits, and the area sizes of blocks for seating the sub circuits and the positions of the sub circuits are determined on the chip.

Figure 2:
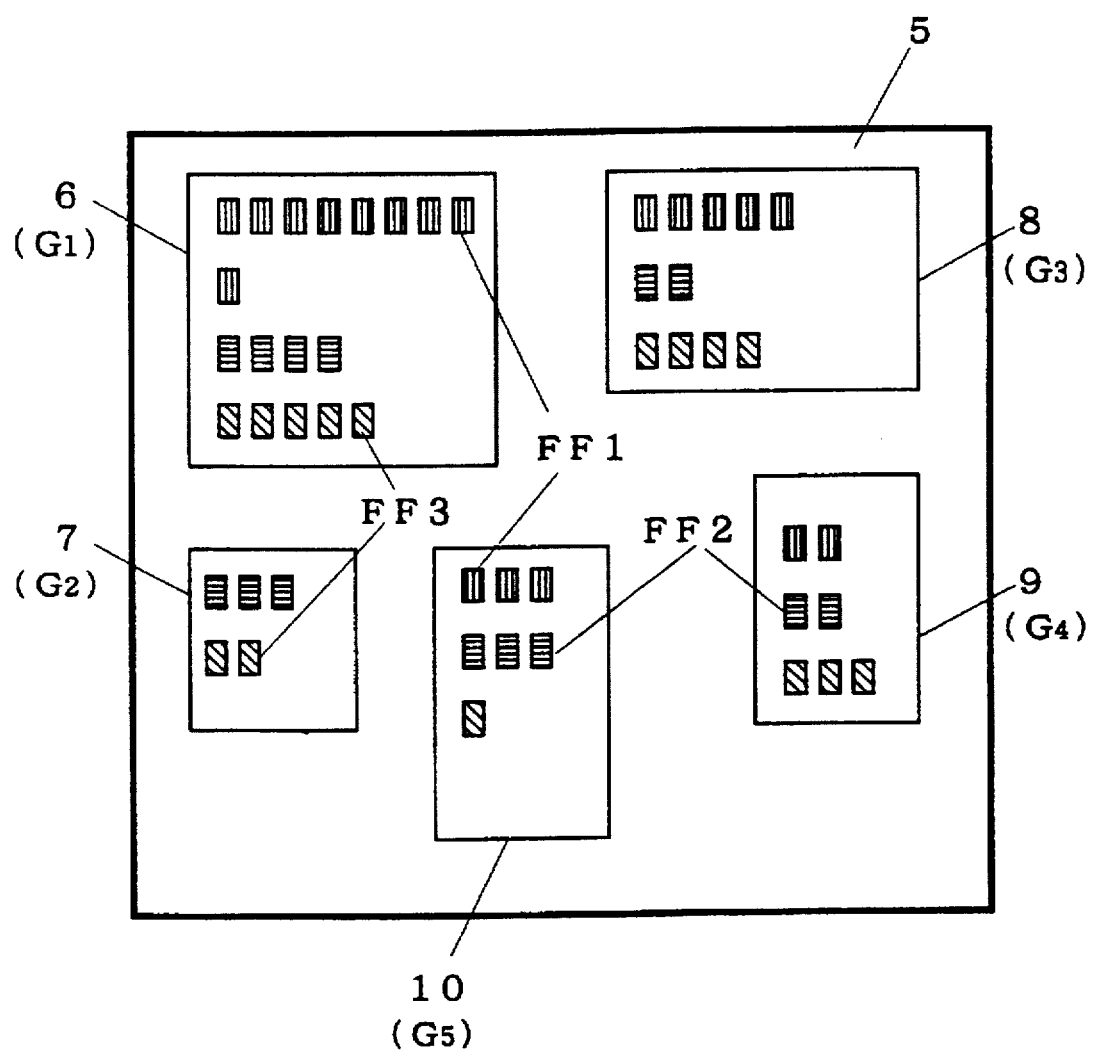
FIG. 2 is a view explaining the first preferred embodiment of the present invention.

FIG. 2 is a view showing a floor plan as it is displayed. On a chip 5, blocks 6 to 10 respectively corresponding to sub circuits $G_1$ to $G_5$ are displayed. Such a floor plan may be displayed by a common display device which is used in a regular CAD. For convenience of description, the graphic displayed as the chip 5 by the display device will be referred to as "chip 5." This will be applied to other elements as well.

At Step S2, the number of cells which are assumed to be the heat source is counted in each block which is designated at Step S1. Only flip-flops are counted as such cells. This is where the present invention is characteristic.

A flip-flop is likely to conduct with the prepense of a clock signal or the like in the circuit. This is why estimation of heat generation using the flip-flop cells is effective in estimating heat which is developed in the entire chip. As a further advantage, in a flip-flop, heat is mostly generated when an inputted clock signal is activated. For this reason, in estimating heat generation in the semiconductor integrated circuit, only the clock signal which is supplied to the semiconductor integrated circuit is noted without considering propagation of all signals which are used in the semiconductor integrated circuit. Hence, estimation of heat generation in the semiconductor integrated circuit is easy and simple.

Since the floor plan does not include information regarding the cells yet, connection information N regarding the sub circuits is needed to execute Step S2. The number of the flip-flops in each block is calculated from the connection information N.

Here, the flip-flops are counted type by type since different types of flip-flops generate different amounts of heat. FIG. 2 also shows flip-flops which are counted type by type in this manner. In FIG. 2, three types of flip-flops are present. Namely, types FF1, FF2 and FF3.

TABLE 1

|     | FF1 | FF2 | FF3 | Total |
|-----|-----|-----|-----|-------|
| $G_1$ | 9 | 4 | 5 | 18 |
| $G_2$ | 0 | 3 | 2 | 5 |
| $G_3$ | 5 | 2 | 4 | 11 |
| $G_4$ | 2 | 2 | 3 | 7 |
| $G_5$ | 3 | 4 | 1 | 8 |

Table 1 shows a result of counting of the flip-flops of FIG. 2 for the respective sub circuits.

Next, at Step S3, a heat quantity per unit area in each block (i.e., average heat quantity) is calculated for each sub circuit. More specifically, average heat quantities are calculated from the area sizes of the blocks, the number of the flip-flops in each sub circuit, and the amount of heat generated in each flip-flop during operation of the flip-flop.

To execute Step S3, a library L1 is necessary which stores a heat quantity of one flip-flop of each type. The library L1 must store heat which is developed for one activation of the clock signal which is supplied to each flip-flop.

In the example of FIG. 2, from Table 1, the average heat quantities are calculated as follows:

$$Q_1=(9 \cdot q_1+4 \cdot q_2+5 \cdot q_3)/A_1$$

$$Q_2=(0 \cdot q_1+3 \cdot q_2+2 \cdot q_3)/A_2$$

$$Q_3=(5 \cdot q_1+2 \cdot q_2+4 \cdot q_3)/A_3$$

$$Q_4=(2 \cdot q_1+2 \cdot q_2+3 \cdot q_3)/A_4$$

$$Q_5=(3 \cdot q_1+4 \cdot q_2+1 \cdot q_3)/A_5$$

where $Q_1$ to $Q_5$: average heat quantities of blocks 6 to 10

$q_1$ to $q_3$: heat quantity of one flip-flop of each type FF1, FF2 or FF3

$A_1$ to $A_5$: area sizes of blocks 6 to 10

In this manner, it is possible to easily estimate heat which is developed in the respective sub circuits as the average heat quantities of the corresponding blocks.

Second Preferred Embodiment

The flow chart in FIG. 1 also shows Step S4 which is related to a second preferred embodiment of the present invention. The Step S4 is to display the average heat quantities of the respective blocks calculated in the first preferred embodiment. For instance, different average heat quantities are colored with different colors and the blocks are displayed in colors which are associated with the respective average heat quantities.

Figure 3:
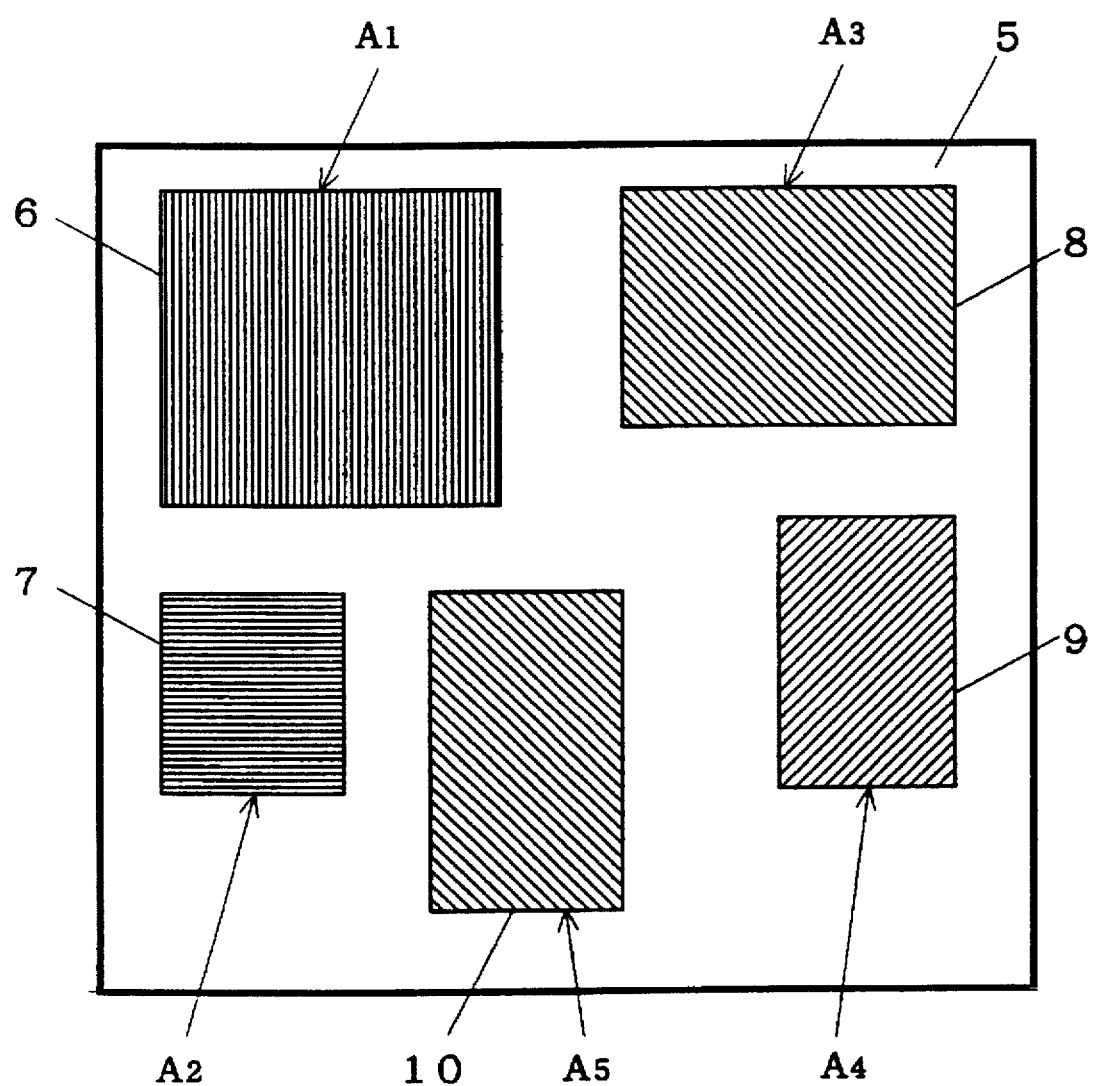
FIG. 3 is a view explaining the second preferred embodiment of the present invention.

FIG. 3 shows the average heat quantities of the respective blocks as they are displayed in the same manner as in FIG. 2. The block 6 may be displayed in red, the block 7 may be displayed in blue, the blocks 8 and 10 may be displayed in green, and the block 9 may be displayed in brown.

With such coloring, it is easy to know which block (sub circuit) is generating more heat than the others.

Third Preferred Embodiment

Figure 4:
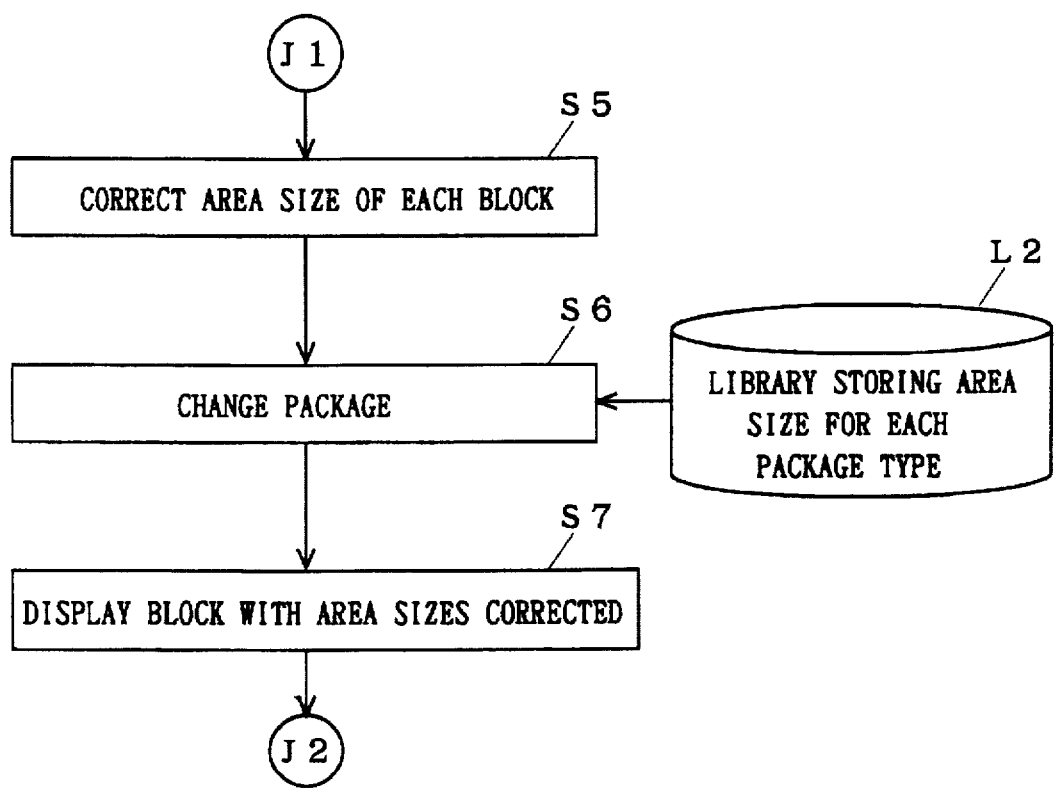
FIG. 4 is a flow chart showing a third, a fifth and a sixth preferred embodiments of the present invention.

FIG. 4 is a flow chart showing a third preferred embodiment of the present invention. The steps following the flow chart symbol J1 are to be executed subsequent to the Step S4.

At Step S5, the area size of each block is corrected. Here, the area sizes $A_1$ to $A_5$ once determined at the Step S1 are changed so that the average heat quantities of the respective blocks become the same.

More particularly, a unified generation value Q, which is an average of the average heat quantities $Q_1$ to $Q_5$ of the respective blocks, is calculated as below. From the unified generation value $\overline{Q}$, corrected area sizes $B_1$ to $B_5$ are calculated.

$$\overline{Q}=(Q_1+Q_2+Q_3+Q_4+Q_5)/5$$

$$B_1=(Q_1/\overline{Q}) \cdot A_1$$

$$B_2=(Q_2/\overline{Q}) \cdot A_2$$

$$B_3=(Q_3/\overline{Q}) \cdot A_3$$

$$B_4=(Q_4/\overline{Q}) \cdot A_4$$

$$B_5=(Q_5/\overline{Q}) \cdot A_5$$

In this manner, by further averaging the average heat quantities of the respective blocks, the average heat quantities of the respective blocks become uniform over the entire chip 5. As a result, distribution of heat becomes even, which is desirable for designing of the semiconductor integrated circuit.

Fourth Preferred Embodiment

The third preferred embodiment requires correction of the area sizes of all blocks. Instead of this, an upper limit $Q_{max}$ of average heat quantities may be set and the area sizes of those blocks which have average heat quantities over this upper limit $Q_{max}$ may be corrected. For example, assuming that only the average heat quantity $Q_1$ of the block 6 is beyond this upper limit $Q_{max}$ in FIG. 3, the area sizes are newly set as:

$B_1 = (Q_1/Q_{max}) \cdot A_1$ $B_2 = A_2$ $B_3 = A_3$ $B_4 = A_4$ $B_5 = A_5$

Where the heat quantity is known under which the operation of the chip 5 is guaranteed, by setting the upper limit $Q_{max}$, the area sizes of the blocks are corrected so that the associated average heat quantities do not exceed the upper limit.

Any block which fails to meet the environmental condition for the operation of the chip 5 is corrected so as to satisfy the environmental condition. Thus, the reliability of the semiconductor integrated circuit is improved.

Fifth Preferred Embodiment

FIG. 4 also shows Step S6 which is related to a fifth preferred embodiment of the present invention. As a result of the area size correction according to the fourth or the fifth preferred embodiment, a sum of the area sizes $B_1$ to $B_5$ of all blocks exceeds the area size of the chip 5 in some cases. If this occurs, it is impossible to mount the sub circuits $G_1$ to $G_5$ on the chip 5.

To deal with this, at the Step S6, the package is changed so that all blocks 6 to 10 are seated on the same chip. To execute the Step S6, a library L2 for storing the sizes of packages of each type is necessary.

TABLE 2

| Package Name | Chip Area Size |
|---|---|
| $P_1$ | $C_1$ |
| $P_2$ | $C_2$ |
| . | . |
| . | . |
| . | . |
| $P_{10}$ | $C_{10}$ |
| . | . |
| . | . |
| . | . |

Table 2 shows the information stored in the library L2. At the Step S6, a package $P_i$ is used which has a chip size $C_i$ larger than the area sizes $B_1$ to $B_5$ as they are combined (i=1, 2, . . .). Of course, it is not necessary to change the chip 5 if the area sizes $B_1$ to $B_5$ as they are combined do not exceed the area size of the chip 5.

By changing the package, it is possible to design the semiconductor integrated circuit on one chip while satisfying a predetermined requirement regarding heat generation.

Although the foregoing has described the invention in relation to where the package is changed, a macro cell which includes a plurality of blocks may be changed instead.

Sixth Preferred Embodiment

FIG. 4 also shows Step S7 which is related to a sixth preferred embodiment of the present invention. The Step S7 is to display the blocks with the area sizes corrected in the fourth or the fifth preferred embodiment. It is therefore easy to confirm an improvement made to the floor plan. It is also easy to correct the configurations or the positions of the blocks.

Figure 5:
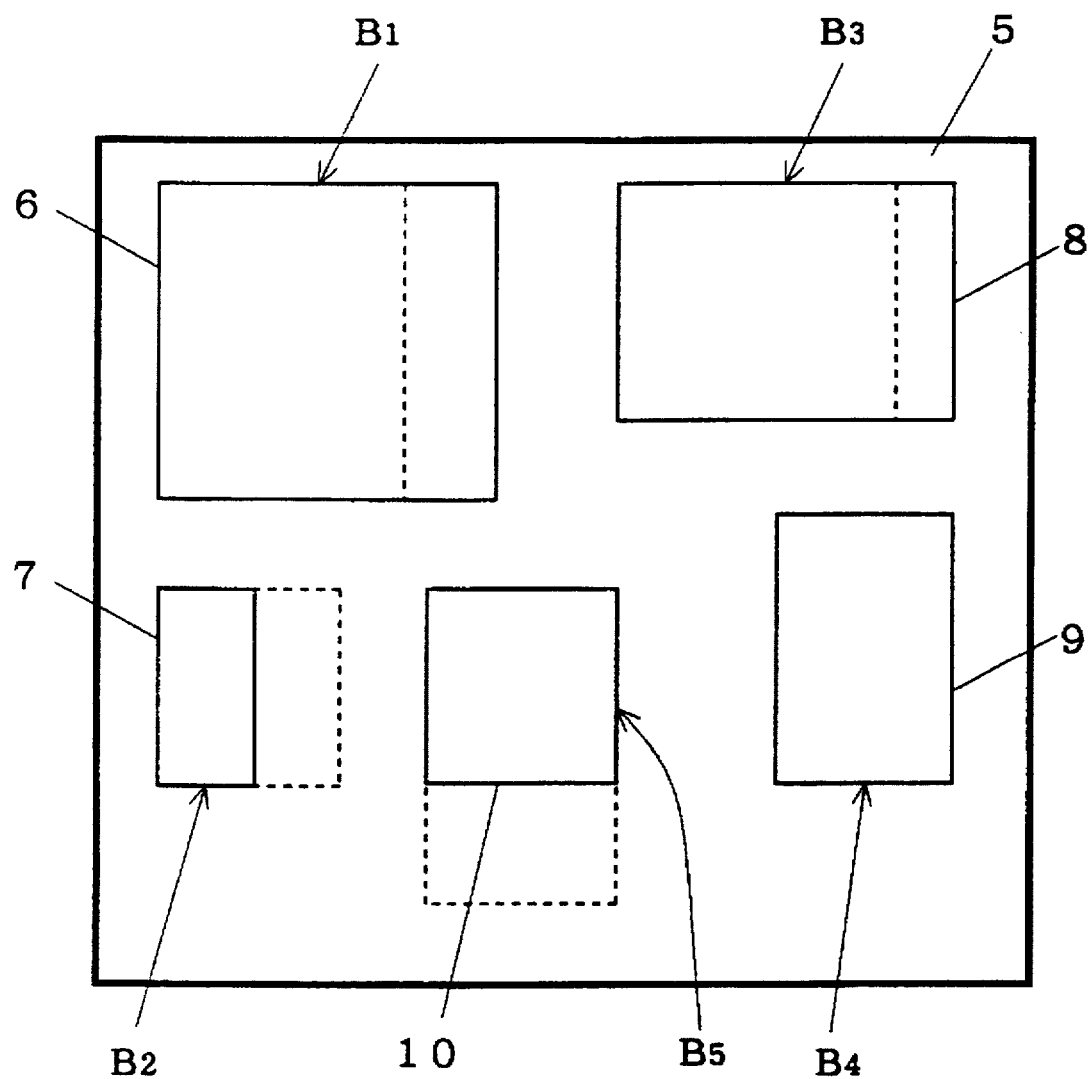
FIG. 5 is a view explaining the sixth preferred embodiment of the present invention.

FIG. 5 is a view showing a result of the Step S7. In FIG. 5, the blocks indicated by the dotted lines are those resulting from the Step S1 while the blocks indicated by the solid lines are those resulting from the Step S5.

Seventh Preferred Embodiment

Figure 6:
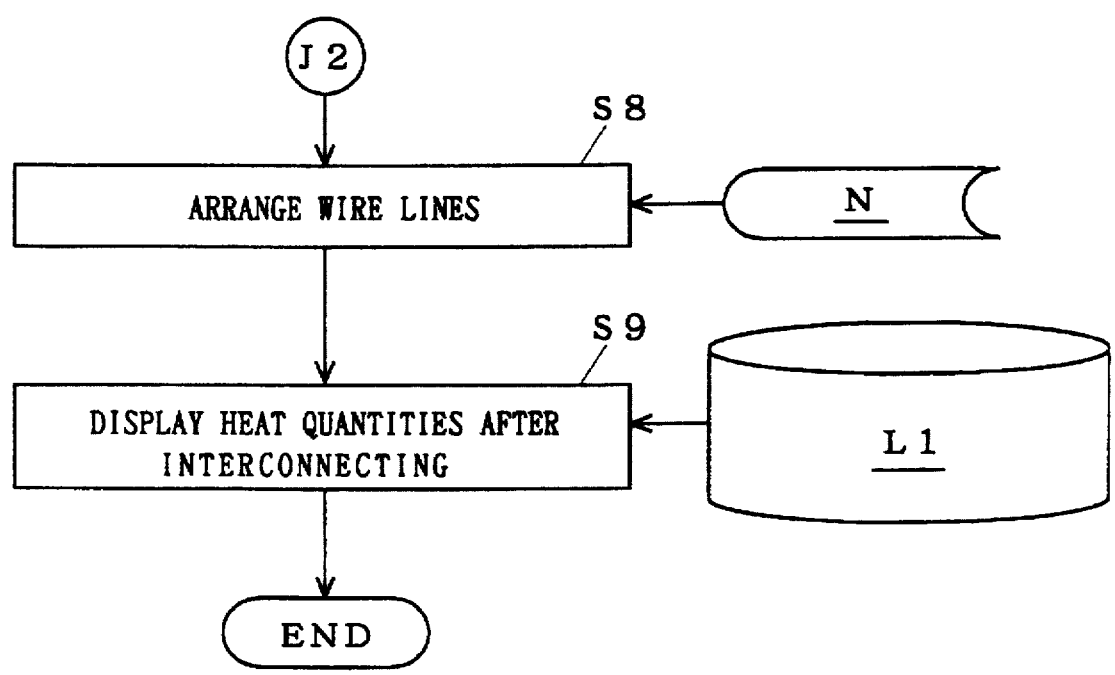
FIG. 6 is a flow chart showing a seventh preferred embodiment of the present invention.

FIG. 6 is a flow chart showing a seventh preferred embodiment of the present invention. The steps following the flow chart symbol J2 are to be executed subsequent to the Step S7.

Figure 7:
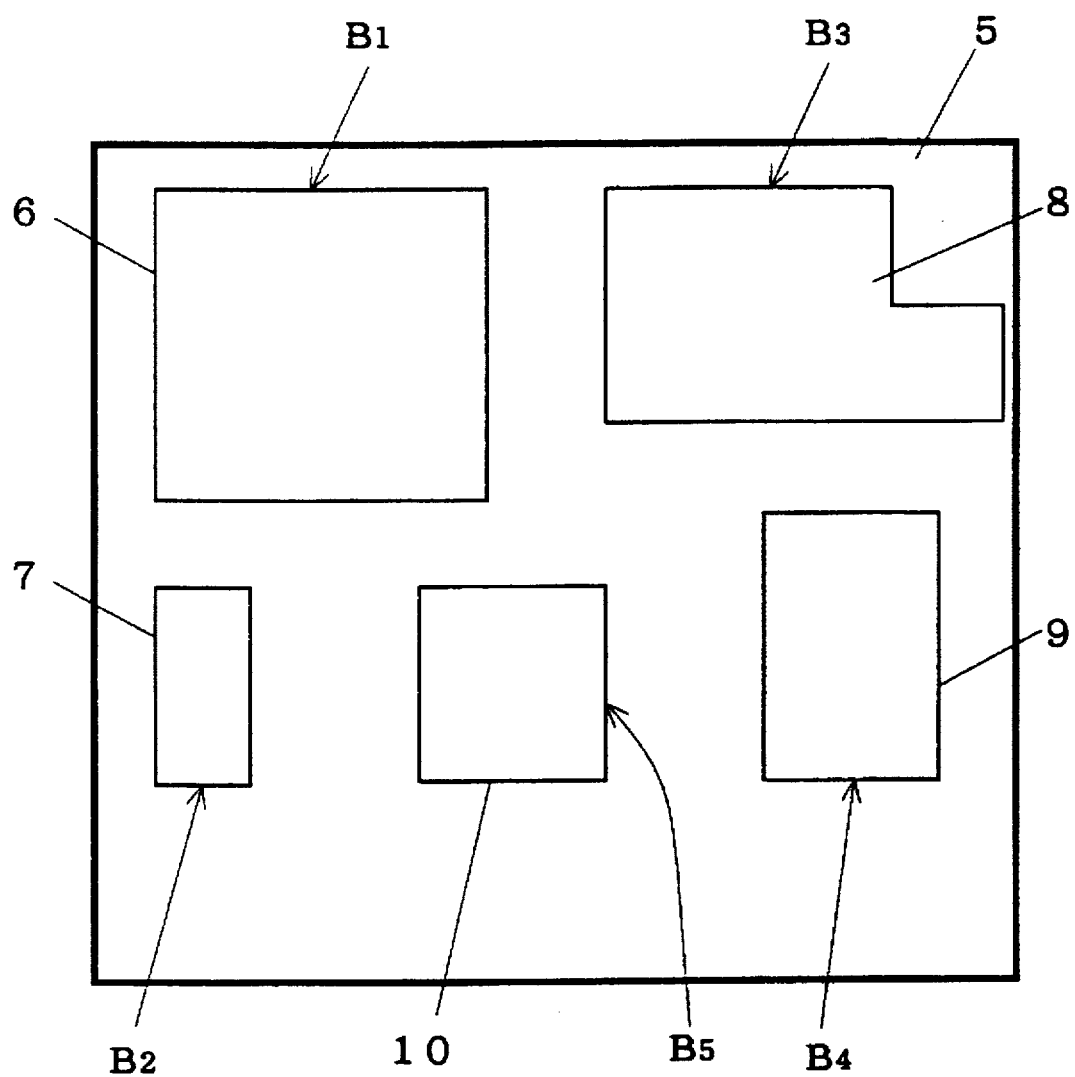
FIGS. 7 and 8 are views explaining the seventh preferred embodiment of the present invention.

At Step S8, wire lines are arranged in accordance with connection information N. At this stage, the configurations of the blocks can be easily corrected as described earlier in relation to the sixth preferred embodiment. In FIG. 7, the configuration of the block 8 is corrected.

Figure 8:
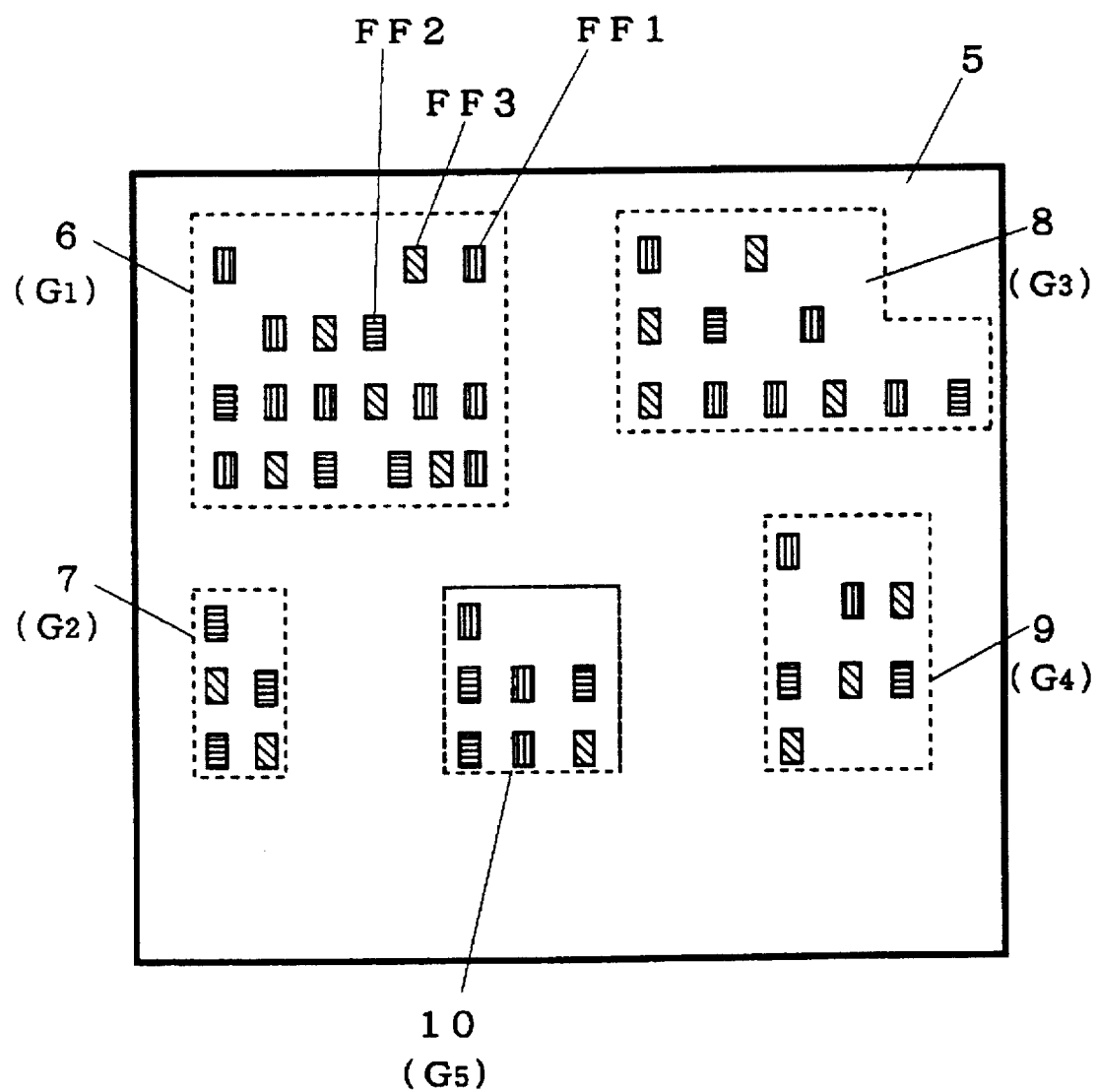

Next, at Step S9, in accordance with the library L1, the heat quantities of the interconnected flip-flops of the respective blocks are displayed in different colors from each other. Such colored display at Step S8 is shown in FIG. 8.

By displaying the heat quantities in this manner, it is possible to see distribution of heat generated due to the flip-flops as they are actually arranged. The configurations of the blocks may be corrected if needed, thereby enhancing the uniformity of the heat distribution in the blocks.

Here, it is to be noted that the blocks correspond to the sub circuits. Unlike in the technique disclosed by Japanese Patent Laid-Open Gazette No. 3-3348, the flip-flops are not exchanged between the blocks. Hence, the uniformity of the heat distribution is increased easily without any complex step of interconnection.

Eighth Preferred Embodiment

Although the first preferred embodiment calculates heat which is generated at one activation of the clock signal which is supplied to each flip-flop, actual heat generation associated with more than one activations of the clock signal can be calculated.

Figure 9:
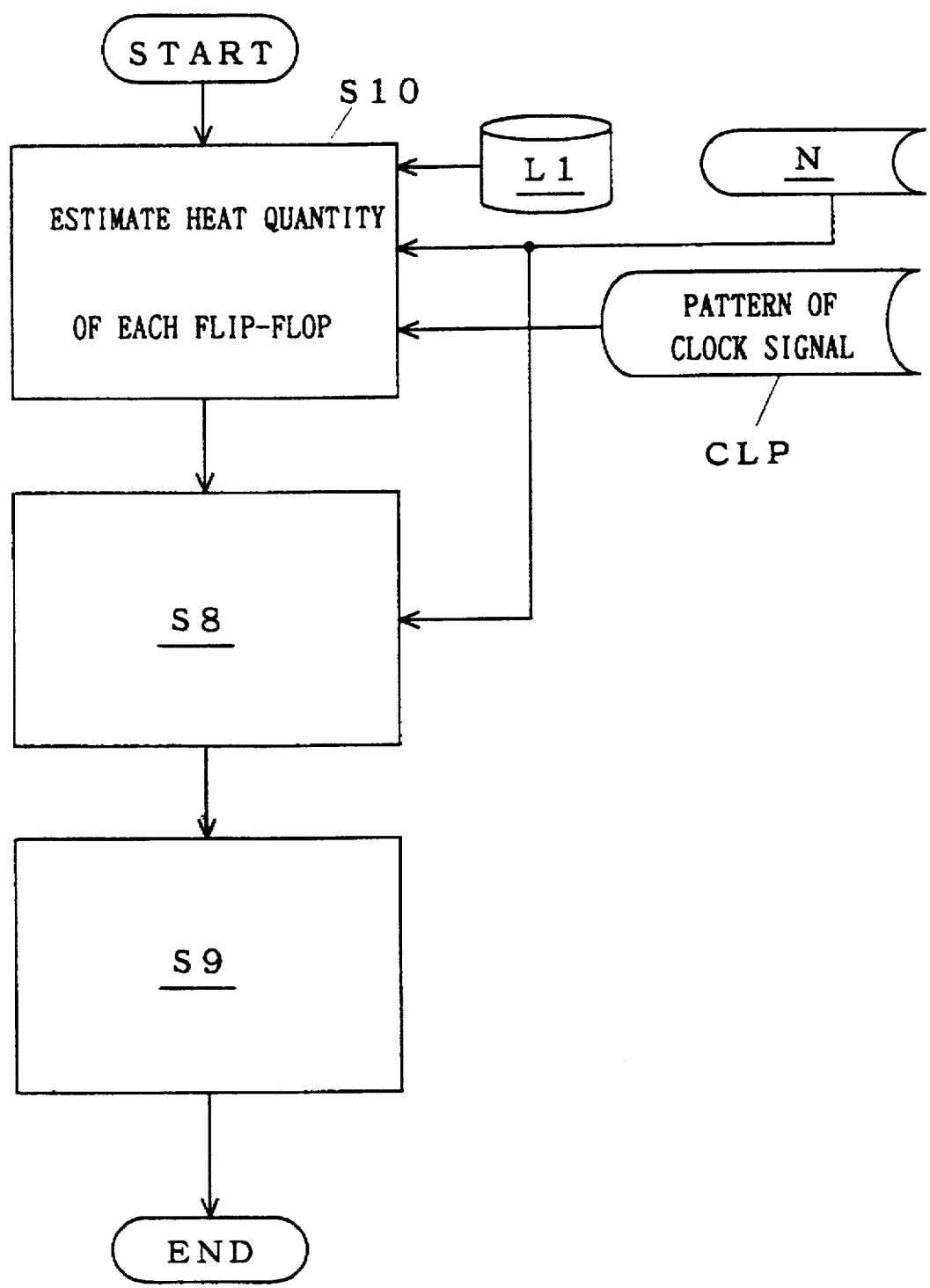
FIG. 9 is a flow chart showing an eighth preferred embodiment of the present invention.

FIG. 9 is a flow chart showing an eighth preferred embodiment of the present invention. At Step S10, heat quantities of the respective flip-flops are estimated. Similar to the Steps S2 and S3, the connection information N and the library L1 are used. In addition to these, a pattern CLP of the clock signal is also used at the Step S10.

After estimating the heat quantities of the respective flip-flops at the Step S10, at the Steps S8 and S9, it is possible to display heat generation as it will be after forming interconnections. Of course, the library L1 is not needed at the Step S9 for this purpose. At the Step S9, it is also possible to display only flip-flops which generate heat over a predetermined heat quantity.

Now, the procedures at the Step S10 will be described in more detail. As previously described in relation to the first preferred embodiment, heat is developed in flip-flops mostly when the received clock signal activates (i.e., at a rise of the clock signal in a flip-flop of a positive edge type and at a fall of the clock signal in a flip-flop of a negative edge type). Noting this, by counting the number of changes in the clock signal which is inputted to a flip-flop, heat generation in the flip-flop receiving the clock signal is estimated.

Figure 10:
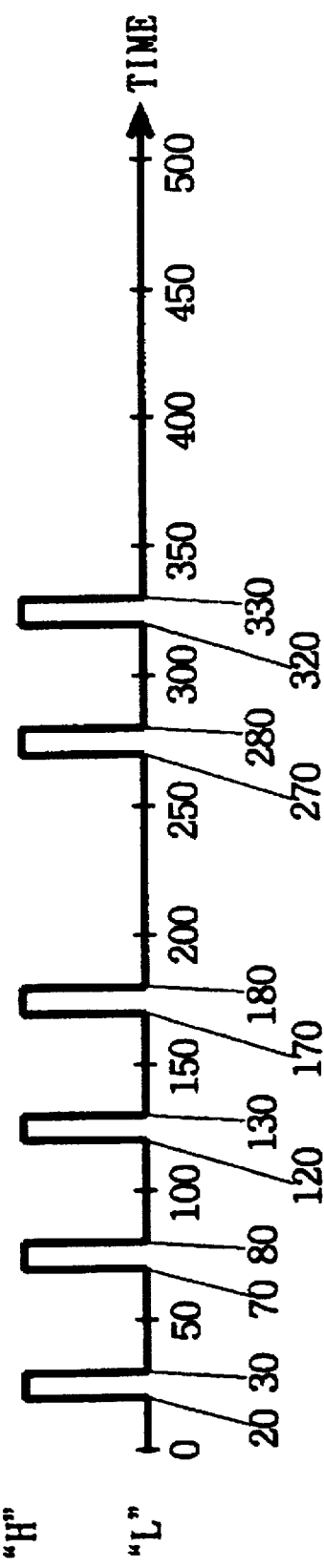
FIGS. 10 to 13 are views explaining the eighth preferred embodiment of the present invention.

FIG. 10 is a view showing a waveform pattern of a clock signal CLK1. The clock signal CLK1 has a waveform in which a pulse of a width of 10 appears in a period of a width of 50 (hereinafter "period width").

Figures 11, 12:
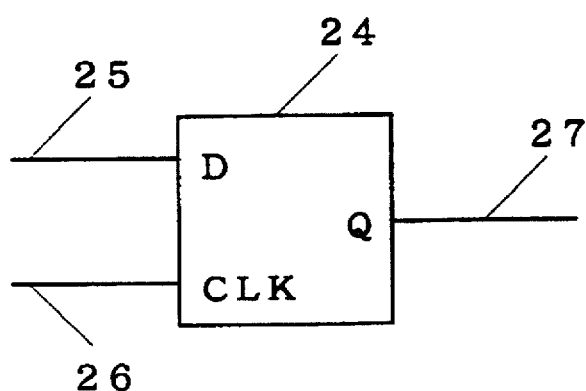

FIG. 11 shows the pattern of FIG. 10 in the event-driven format. This is to show only the time, the change in the signal and the value of the signal of only when the clock signal CLK1 changes. From FIGS. 10 and 11, it can be seen that the clock signal CLK1 changes thirteen times in total.

Of the flip-flops for which heat generation is to be calculated, with respect to those which are activated by a rise of the clock signal CLK1 (i.e., positive edge type), the number of rises of the clock signal CLK1 must be calculated. Since the clock signal CLK1 alternately rises and falls and the clock signal CLK1 is initially set at the time 0, the number of rises of the clock signal CLK1 is calculated by dividing the total number of the changes in the clock signal CLK1 by 2 and by thereafter rounding off to the decimal point. In the example of FIGS. 10 and 11, the clock signal CLK1 rises six times.

FIG. 12 is a diagram showing connection information expressing a flip-flop 24 for which heat generation is to be calculated. The flip-flop 24 includes a data input terminal D which is generally indicated at 25, a clock input terminal CLK which is generally indicated at 26 and a data output terminal Q which is generally indicated at 27.

Figure 13:
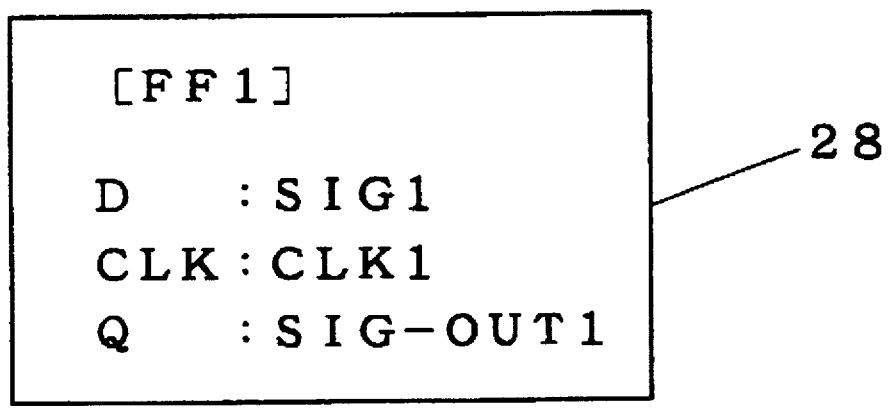

FIG. 13 shows connection information regarding the flip-flop 24. The first line describes that the type of the flip-flop 24 is FF1, the second line describes that the data input terminal D receives a signal SIG1, the third line describes that the clock input terminal CLK receives the clock signal CLK1, and the fourth line describes that the data output terminal Q receives a signal SIG-OUT1.

With the connection information of FIGS. 12 and 13 available, the activation number of the clock signal CLK of FIGS. 10 and 11 found and heat generated in a flip-flop of the type FF1 due to one activation of the clock signal known from the library L1, it is possible to calculate actual heat generation associated with a plurality of activations of the clock signal.

This embodiment is particularly effective to deal with a case where there are a plurality of flip-flops which operate in response to different clock signals. For instance, while a flip-flop receiving a clock signal which is frequently activated generates more heat than a flip-flop receiving a clock signal which is rarely activated. If these flip-flops of different nature are dealt with without considering the difference, estimation of heat is inaccurate.

However, as described above, a heat quantity is calculated based on the number of activations of the clock signal in this embodiment. Hence, even when there are a plurality of flip-flops which operate in response to different clock signals, an estimated heat quantity is nevertheless reliable.

Ninth Preferred Embodiment

In the eighth preferred embodiment, the number of all heat-generating activations of the clock signal are counted. Considering in time sequence (i.e., in accordance with an elapsed time), this is equal to estimation based on an assumption generated heat is reserved without discharged at all. However, the generated heat is dissipated in reality. Hence, heat generation can be estimated even more accurately by taking this into consideration.

Figure 14:
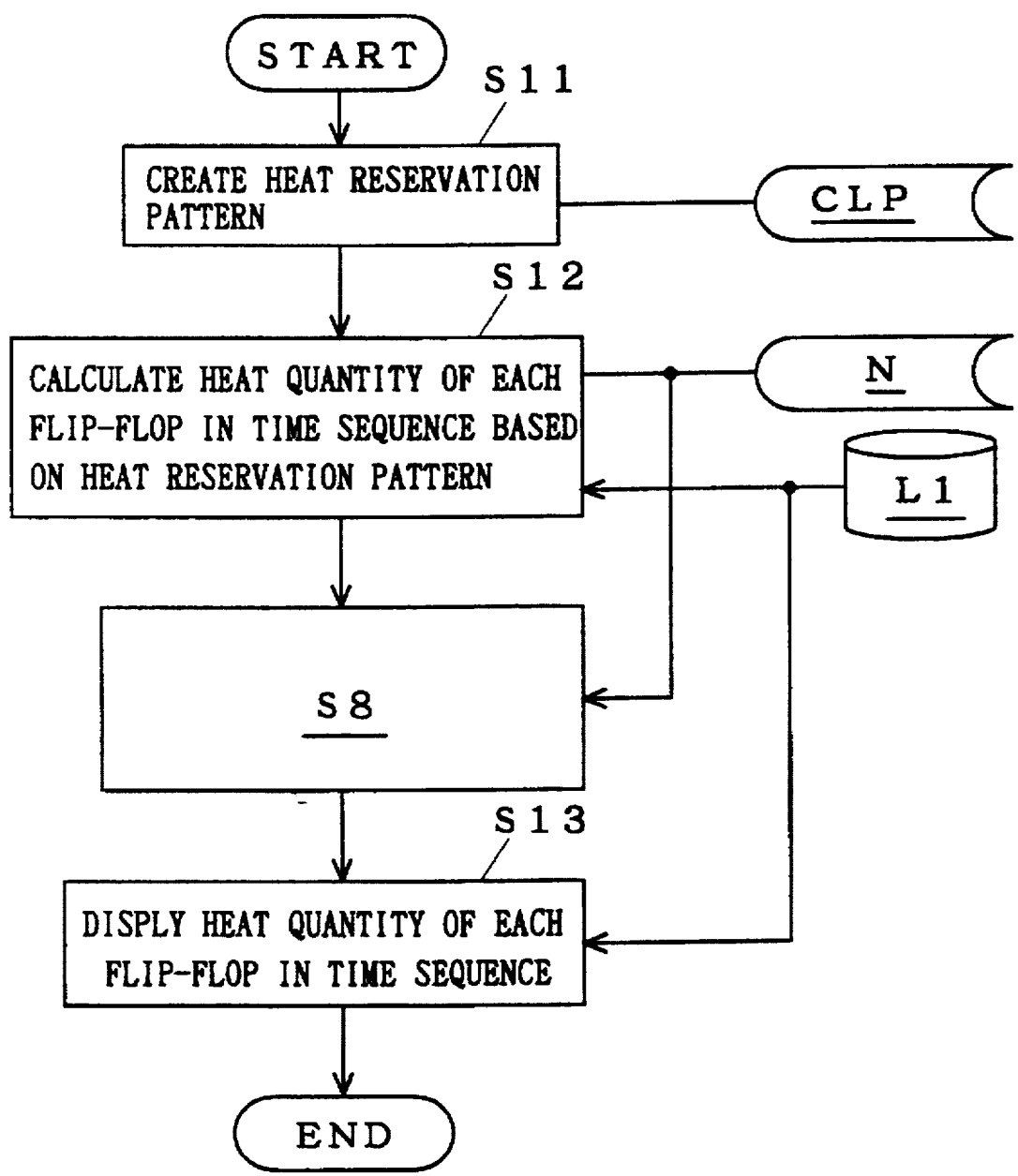
FIG. 14 is a flow chart showing a ninth and a tenth preferred embodiments of the present invention.

FIG. 14 is a flow chart showing a ninth preferred embodiment of the present invention. At Step S11, a heat reservation pattern considering the activation number of the clock signal and heat dissipation is created.

Figures 15, 16:
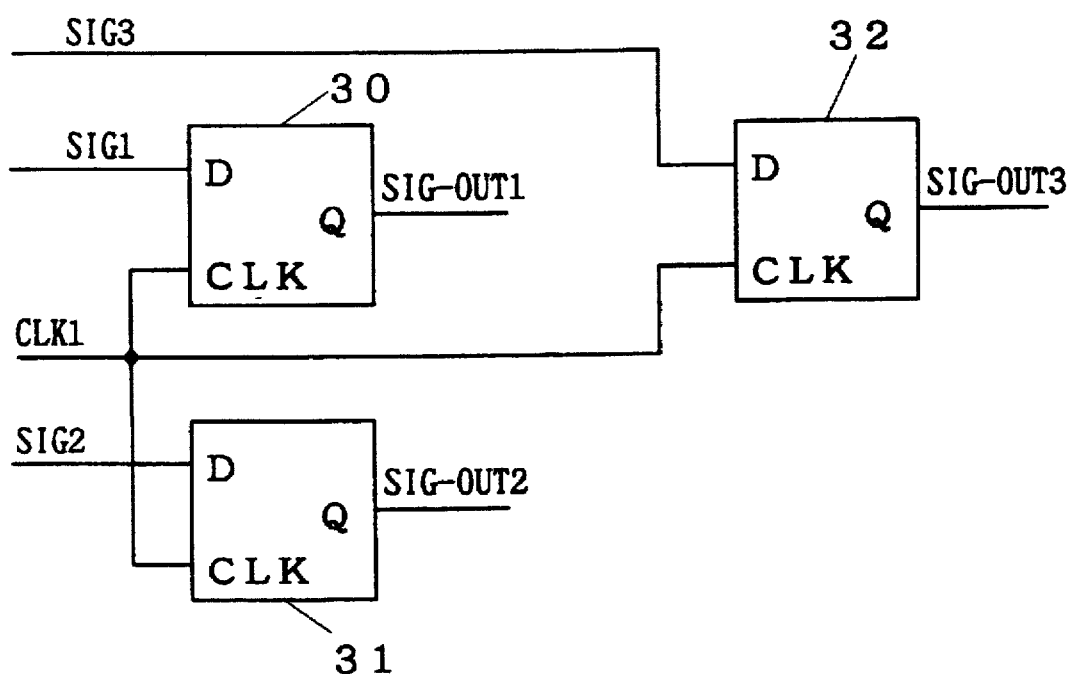
FIG. 15 is a view explaining the ninth preferred embodiment of the present invention.
FIG. 16 is a circuit diagram explaining the tenth preferred embodiment of the present invention.

FIG. 15 shows such a heat reservation pattern. This pattern is for the clock signal CLK1 of FIGS. 10 and 11. The heat reservation pattern is generated for every period having a period width of 50. First, in the first period (time 0 to 50), since the clock signal CLK1 changes three times including the initial setting at the time 0, the first term of the heat reservation pattern is "3."

Next, in the second period (time 50 to 100), the clock signal CLK1 changes twice. Assuming that heat generated during the first period is still reserved without dissipated, the second term of the heat reservation pattern is "5," which is a sum of "3" and "2."

In a similar manner, for the third period (time 100 to 150), the third term of the heat reservation pattern is calculated to be "7," a sum of "5" and "2." That is, an assumption here is that heat generated during the first and the second periods is still reserved without dissipated in the third period.

For the fourth period (time 150 to 200) however, assuming that heat generated during the first period is discharged and therefore should be ignored, the total number of the changes in the clock signal CLK1 during the second, the third and the fourth periods, that is, (2+2+2=6) is determined as the fourth term of the heat reservation pattern. More precisely, a first rule of generating the heat reservation pattern is:

(a) to accumulate the changes in the clock signal during a target and two precedent periods to calculate a term of the heat reservation pattern which corresponds to the target period.

The clock signal CLK1 does not change at all during the fifth period (time 200 to 250). Here, it is assumed that the flip-flop is cooled naturally in the fifth period and the heat generated in the precedent periods is discharged. The term of the heat reservation pattern is therefore "0." That is, a second rule of generating the heat reservation pattern is:

(b) to determine the term of the heat reservation pattern which corresponds to the target period as "0" if there is no change in the clock signal during the target period.

By generating the heat reservation pattern according to such rules, it is possible to estimate heat generation by the flip-flops in a time-series manner considering even dissipation of the generated heat. At Step S12, heat generation is calculated regarding a particular target period as in the Steps S2 and S3. By serially changing the target period, heat generation is calculated in time sequence.

With respect to a flip-flop which generates heat in response to a rise of the clock signal CLK, the respective terms of the heat reservation pattern may be divided by 2 and the results may be rounded off to the decimal point. From FIG. 15, it can be seen that generated heat becomes largest during the third and the fourth periods.

Generation of the heat reservation pattern may not be created in accordance with the rules (a) and (b). Although the rule (b) assumes that all heat generated in precedent periods is dissipated during a period in which heat is not generated, it may be assumed that heat generated during the period before the immediately precedent period alone is sufficiently discharged and heat generated in the immediately precedent period alone may be considered. In this case, the number of changes in the clock signal during the immediately precedent period may be used as the term of the heat reservation pattern which corresponds to the target period.

Tenth Preferred Embodiment

FIG. 14 also shows Steps 8 and 13 which are related to a tenth preferred embodiment of the present invention. Following the Step S12, wire lines are arranged at Step S8 as in the seventh preferred embodiment.

FIG. 16 is a circuitry diagram showing an example of the sub circuit. In this sub circuit, signals SIG1, SIG2 and SIG3 are supplied to flip-flops 30, 31 and 32, respectively. The flip-flops 30, 31 and 32 output signals SIG-OUT1, SIG-OUT2 and SIG-OUT3, respectively, in accordance with the clock signal CLK1.

In FIG. 17, the three boxes show connection information regarding the flip-flops 30, 31 and 32 in this order from the left, corresponding to the sub circuits of FIG. 16. The meaning of each line in each box is the same as the connection information shown in FIG. 13.

Table 3 below shows x-y coordinate values expressing the positions of the flip-flops 30, 31 and 32 which are found at the Step S8. These coordinate values expressing the positions of the flip-flops may be $(x_1, y_1)$, $(x_2, y_2)$ and $(x_3, y_3)$ which correspond to the lower-left apexes of the respective flip-flops.

TABLE 3

| |
|---|
| 30 $(x_1, y_1)$ |
| 31 $(x_2, y_2)$ |
| 32 $(x_3, y_3)$ |

At Step S13, based on the coordinate values listed in Table 3 which are found at the Step S8, the flip-flops 30, 31 and 32 are displayed as they are arranged on a block which corresponds to the sub circuit which is formed by the flip-flops 30, 31 and 32. Wire lines are displayed in accordance with the connection information of FIG. 17.

Further, from the heat reservation pattern obtained at the Step S12, the heat quantities during the respective periods are displayed with different colors at the positions $(x_1, y_1)$, $(x_2, y_2)$ and $(x_3, y_3)$. To this end, the library L1 is used since heat generated by one activation of the clock signal is different depending on the type of the flip-flops.

Figure 18:
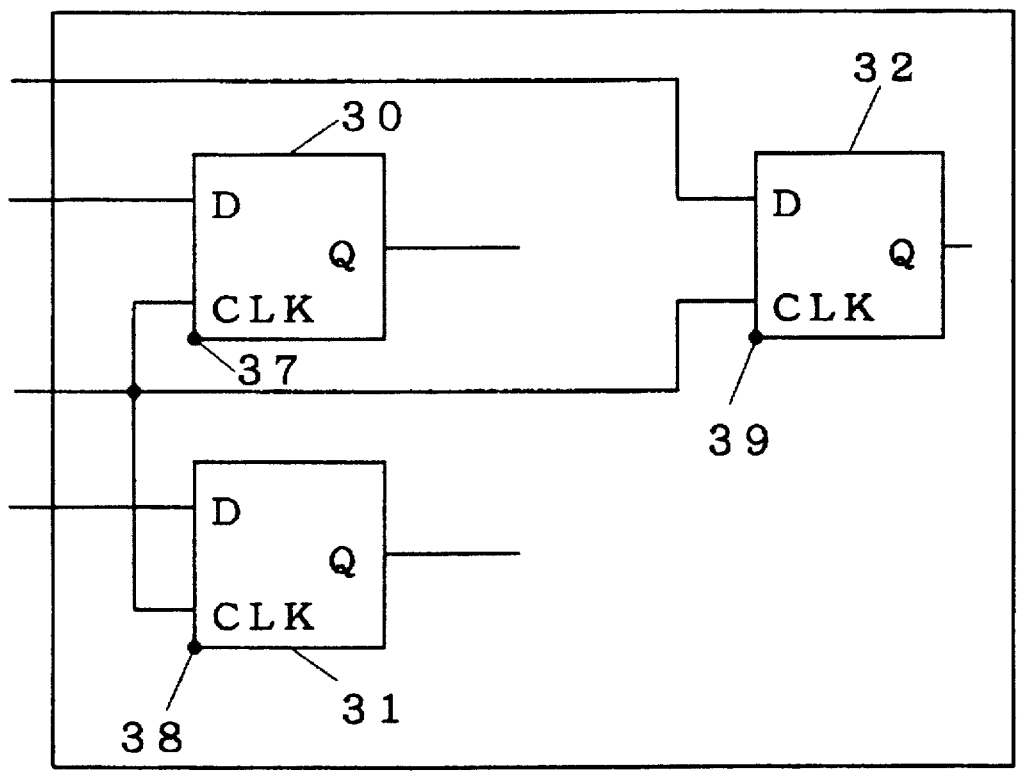

FIG. 18 shows a result of the Step S13. The points 37, 38 and 39 express the lower-left apexes of the respective flip-flops 30, 31 and 32, respectively. At these points, developed heat is displayed in colors.

Displayed in this manner, heat generation at a coordinate point on the block and hence on the chip is judged and confirmed visually in time sequence.

While the invention has been described in detail, the foregoing description is in all aspects illustrative and not restrictive. It is understood that numerous other modifications and variations can be devised without departing from the scope of the invention.

We claim:

1. A method of estimating heat developed in a semiconductor integrated circuit comprising a plurality of sub circuits and clock-synchronized elements which operate when a clock signal is activated, at least one of said sub circuits including at least one of said clock-synchronized elements, said method comprising the steps of:

establishing a plurality of seating areas for seating said sub circuits in a design area;

determining a number of said clock-synchronized elements in each of said sub circuits;

calculating heat quantities of said clock-synchronized elements; and calculating average heat quantities for respective of said seating areas, each of said average heat quantities is an average heat per unit area in each of said seating areas, using said number determined in said determining step and said heat quantities of said clock synchronized elements calculated in said step of calculating heat quantities.

2. The method of claim 1, wherein said clock-synchronized elements comprise a plurality of different elements, and said step of calculating heat quantities uses a heat quantity library which stores heat quantities associated with the different clock-synchronized elements.

3. The method of claim 1, further comprising the step of displaying said seating areas with different visual expressions in accordance with respective of said average heat quantities corresponding to said seating areas.

4. The method of claim 3, wherein said displaying step comprises displaying said different visual expressions as different colors.

5. The method of claim 1, further comprising the step of correcting respective sizes of said seating areas so that said average heat quantities become uniform between all of said seating areas.

6. The method of claim 5, wherein said correcting step comprises the steps of:

adding said average heat quantities to provide an adding result;

dividing said adding result by a number of said seating areas to obtain a unified average heat quantity;

dividing said average heat quantities by said unified average heat quantity to obtain respective divided values; and multiplying said respective sizes of said seating areas by said respective divided values to correct said sizes of said seating areas.

7. The method of claim 5, wherein said correcting step is performed on only those of said seating areas having average heat quantities over a predetermined upper limit heat quantity value.

8. The method of claim 7, further comprising the step of changing said design area when a sum of said sizes of said seating areas is larger than a predetermined upper limit area size value, said changing step performed after said correcting step.

9. The method of claim 5, further comprising the step of displaying said seating areas with said sizes corrected after said correcting step.

10. The method of claim 6, further comprising the step of displaying said seating areas with said sizes corrected after said correcting step.

11. The method of claim 7, further comprising the step of displaying said seating areas with said sizes corrected after said correcting step.

12. The method of claim 8, further comprising the step of displaying said seating areas with said sizes corrected after said correcting step.

13. A method of estimating heat developed in a semiconductor integrated circuit comprising a plurality of sub circuits and clock-synchronized elements which operate when a clock signal is activated, at least one of said sub circuits including at least one of said clock-synchronized elements, said method comprising the steps of:

establishing a plurality of seating areas for seating said sub circuits in a design area;

determining a number of said clock-synchronized elements in each of said sub circuits;

calculating heat quantities of said clock-synchronized elements;

arranging wire lines in each of said sub circuits; and displaying said clock-synchronized elements whose positions are determined relative to said wire lines with different visual expressions in accordance with said heat quantities of said clock-synchronized elements calculated in said calculating step.

14. The method of claim 13, wherein said displaying step comprises displaying said different visual expressions as different colors.

15. The method of claim 13, wherein said calculating step comprises the steps of:

determining a number of activations of said clock signal for respective of said plurality of sub-circuits; and calculating respective heat quantities of said clock-synchronized elements based on the number of activations determined in said determining step.

16. The method of claim 15, wherein:

said clock signal is activated once during each of a set of predetermined cyclic periods and said step of calculating respective heat quantities comprising the steps of:

determining a total number of activations of said clock signal during a target period which is one of said set of predetermined cyclic periods, wherein at least one of said set of predetermined cyclic periods precedes said target period; and generating a heat reservation pattern which expresses said set of predetermined cyclic periods, comprising steps of, repeating said step of determining a total number of activations, and serially updating said target period based on said total number of activations determined in said repeating step, wherein said step of calculating respective heat quantities comprises calculating said heat quantities of said clock-synchronized elements in time sequence in accordance with said heat reservation pattern.

17. The method of claim 16, wherein said step of generating a heat reservation pattern comprises:

determining a value of said heat reservation pattern to be zero if no activation of said clock signal occurs during said target period.

18. The method of claim 16, wherein said displaying step comprises displaying respective positions of said clock-synchronized elements with different colors in accordance with said heat quantities of said clock-synchronized elements previously calculated in time sequence.

* * * * *

UNITED STATES PATENT AND TRADEMARK OFFICE
CERTIFICATE OF CORRECTION

PATENT NO.   : 5,640,329
DATED        : June 17, 1997
INVENTOR(S)  : Mitsunori MATSUNAGA, et al.

It is certified that error appears in the above-indentified patent and that said Letters Patent is hereby corrected as shown below:

On the title page, item [30], Foreign Application Priority Data should be:

--Aug. 9, 1994  [JP]  Japan .......... 6-186971--

Signed and Sealed this

Ninth Day of September, 1997

Attest:

BRUCE LEHMAN

Attesting Officer

Commissioner of Patents and Trademarks